United States Patent
Ohshima et al.

(10) Patent No.: US 7,759,652 B2
(45) Date of Patent: Jul. 20, 2010

(54) ELECTRON LENS AND CHARGED PARTICLE BEAM APPARATUS

(75) Inventors: Takashi Ohshima, Saitama (JP); Mitsugu Sato, Hitachinaka (JP); Yutaka Kaneko, Mitaka (JP); Souichi Katagiri, Kodaira (JP); Koichiro Takeuchi, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 397 days.

(21) Appl. No.: 11/749,181

(22) Filed: May 16, 2007

(65) Prior Publication Data

US 2008/0067396 A1    Mar. 20, 2008

(30) Foreign Application Priority Data

May 17, 2006    (JP)    ............................ 2006-137815

(51) Int. Cl.
*H01J 1/50*    (2006.01)
(52) U.S. Cl. .............................................. 250/396 ML
(58) Field of Classification Search ............. 250/396 R, 250/397, 398, 399, 396 ML; 335/209–214, 335/296–298, 304, 306
See application file for complete search history.

(56) References Cited

U.S. PATENT DOCUMENTS

| | | | | |
|---|---|---|---|---|
| 3,818,394 A | * | 6/1974 | Katagiri et al. | ............. 335/210 |
| 4,468,563 A | * | 8/1984 | Tsuno et al. | .......... 250/396 ML |
| 4,488,043 A | * | 12/1984 | Bahr et al. | .................. 250/311 |
| 4,806,766 A | * | 2/1989 | Chisholm | ............ 250/396 ML |
| 5,319,497 A | * | 6/1994 | Wakabayashi et al. | ... 250/201.5 |
| 5,334,910 A | * | 8/1994 | Karsten et al. | ............... 335/210 |
| 6,002,135 A | * | 12/1999 | Veneklasen et al. | ... 250/396 ML |

(Continued)

FOREIGN PATENT DOCUMENTS

JP    7-001681    1/1995

OTHER PUBLICATIONS

"Permanent Magnet Lenses", written by J. H. Reisner (Journal of Applied Physics, vol. 22, May 1951, pp. 561).

(Continued)

*Primary Examiner*—Jack I Berman
*Assistant Examiner*—Brooke Purinton
(74) *Attorney, Agent, or Firm*—Antonelli, Terry, Stout & Kraus, LLP.

(57) ABSTRACT

The present invention provides a compact electron lens causing little aberration, and a charged particle beam apparatus such as a scanning electron microscope that is super compact and offers a high resolution. An upper magnetic pole and a sample-side magnetic pole are magnetically coupled to the respective poles of a permanent magnet that is made of a highly strong magnetic material such as a rare-earth cobalt system or a neodymium-iron-boron system, that is axially symmetrical, and that has a hole in the center thereof. An inner gap is created on the side of a center axis. Thus, a magnetic lens is formed axially. Moreover, a semi-stationary magnetic path that shields an outside magnetic field and has the magnetic reluctance thereof regulated is disposed outside. The sample-side magnetic pole and magnetic path defines a region where magnetic reluctance is the highest outside the permanent magnet. A space defined by the permanent magnet, upper magnetic pole, sample-die magnetic pole, and semi-stationary magnetic path is filled with a filling made of a non-magnetic material. Thus, an objective lens is constructed.

19 Claims, 10 Drawing Sheets

U.S. PATENT DOCUMENTS

| | | | |
|---|---|---|---|
| 6,320,194 B1* | 11/2001 | Khursheed et al. | 250/442.11 |
| 2004/0211914 A1* | 10/2004 | Buijsse | 250/396 R |
| 2005/0035299 A1* | 2/2005 | Uhlemann et al. | 250/396 R |
| 2005/0052103 A1 | 3/2005 | Katagiri et al. | |
| 2006/0076489 A1 | 4/2006 | Ohshima et al. | |
| 2006/0231773 A1 | 10/2006 | Katagiri et al. | |

OTHER PUBLICATIONS

"A New Permanent Magnet Lens System and its Characteristics", written by H. Kimura (Applied Physics, vol. 26, 1957, pp. 45).

* cited by examiner

ELECTRON LENS AND CHARGED PARTICLE BEAM APPARATUS

CLAIM OF PRIORITY

The present invention claims priority from Japanese Application JP2006-137815 filed on May 17, 2006, the content of which is hereby incorporated by reference on to this application.

BACKGROUND OF THE INVENTION (1) Field of the Invention

The present invention relates mainly to an electron beam application technology adaptable to a scanning electron microscope (SEM) that uses an electron beam to permit observation of a microstructure.

(2) Description of the Related Art

A magnetic lens composed of coils and a magnetic circuit is usually adopted as an objective lens to be included in conventional scanning electron microscopes (SEM). A strong magnetic field is needed in order to focus a beam of electrons on a microscopic point, and an amount of current flowing through the coils has to be increased accordingly. Therefore, measures have to be taken against a rise in temperature caused by heat dissipated from the coils. Namely, a thick wire is wound in order to form the coils or a cooling water pipe is employed. Moreover, since an adiabatic state is established in a vacuum in a sample chamber, a vacuum sealing structure is needed. For these reasons, the objective lens included in a high-resolution scanning electron microscope (SEM) is large in size or the diameter or height of the objective lens ranges from 15 cm to 40 cm.

On the other hand, as a compact high-resolution SEM, an SEM described in, for example, Japanese Examined Patent Application Publication No. 7-1681 (FIG. 1) is known. Herein, an electrostatic lens is used to focus an electron beam. While an electrode outside an objective lens is retained at 0 V, a positive high voltage is applied to an electrode in the upper part of the objective lens in order to accelerate electrons. Thus, the high-resolution compact SEM is realized. When an objective lens is realized using the electrostatic lens, the objective lens can be so small in size that the diameter thereof is several centimeters or less. However, the upper limit of a resolution ranges from about 4 nm to about 6 nm. The higher resolution cannot be attained because of restrictions derived from a voltage the electrostatic lens can withstand and aberration the electrostatic lens brings about.

The idea of adopting a permanent magnet as a magnetic field source for a magnetic lens instead of coils has already been disclosed in 1950s. For example, "Permanent Magnet Lenses" written by J. H. Reisner (Journal of Applied Physics, Vol. 22, 1951, pp. 561) (Related Art 1) describes a structure adaptable to the magnetic field source. As shown in FIG. 2A, the structure has four bar magnets 20 disposed in parallel with one another at axially symmetrical positions. An outer magnetic path 21 and an inner magnetic path 22 that are axially symmetrical structures made of a soft magnetic material are magnetically connected to the south and north poles of the bar magnets. Electron lenses 24 take place in two respective places in each of which the magnetic path structures have a gap between them. By sophisticating this technology, a compact electron microscope permitting adjustment of a focal length has been realized. For example, "A New Permanent Magnet Lens System and its Characteristics" written by H. Kimura (Applied Physics, Vol. 26, 1957, pp. 45) (Related Art 2) describes such a compact electron microscope. Herein, two or three lenses are each composed of a permanent magnet and a magnetic circuit including soft magnetic substances.

SUMMARY OF THE INVENTION

The adoption of a permanent magnet as a magnetic objective lens, which is included in a compact SEM having an electrostatic lens, is an easily conceivable approach to construction of a compact high-resolution SEM. However, the permanent magnet externally induces leakage flux. In order to prevent the induction of the leakage flux, the lens structure including two or more lenses is adopted as it is by the Related Arts 1 and 2. The reasons why the lens structure is adopted will be described below.

Assuming that a permanent magnet 1 being axially symmetrical as shown in FIG. 2B, having a hole in the center thereof, and being magnetized vertically is employed, a magnetic circuit made of a soft magnetic material is used to confine magnetic field lines 101, which pass through the hole, to a desired region. Thus, a magnetic lens is constructed. However, when doughnut-shaped magnetic pole plates 25 made of a soft magnetic material are, as shown in FIG. 2C, disposed up and down, magnetic flux leaks out. The magnetic leakage adversely affects an electron optical system or any other apparatus located outside the lens. Moreover, the objective lens functions as a strong magnet and attracts iron or the like. This hazards a person who uses the SEM or performs maintenance work. On the other hand, when the external sides of the upper and lower magnetic pole plates 25 are magnetically joined using a soft magnetic material in order to shield outgoing leakage flux, the magnetic reluctance of the path linking the external sides gets weakened. This leads to an increase in the magnitude of magnetic flux moving outside. The total magnitude of magnetic flux is determined with a permanent magnet. Therefore, a magnetic field realizing the lens gets weakened, and the lens structure does not function as a lens any longer. The conventional multistage lens structure is intended to realize an electron lens by axially deflecting electrons using a magnetic circuit for the purpose of preventing the outgoing magnetic leakage. Therefore, the structure includes two or more lenses.

However, the adoption of the lens structure as an objective lens to be included in a compact SEM poses a problem in that that the size of the objective lens gets large. Moreover, when the two magnetic pole plates constituting a lens are disposed closely to each other in order to realize a small-size objective lens, an axial distribution of magnetic field strengths is plotted to have a ridge and a valley. A sharp change in the magnetic field strength is observed in the center of the magnetic field, and a moderate change therein is observed in the parts thereof preceding and succeeding the center thereof. Therefore, aberration cannot be reduced. This poses a problem in that a high resolution can hardly be attained.

Moreover, the space around the center axis along which electrons move has to be a vacuum. The gaps between the magnetic substances 21 and 22 are, as shown in FIG. 2A, filled with brass 23 that serves as a vacuum seal. The periphery of the lens structure is exposed to the atmospheric pressure.

An object of the present invention is to provide a compact electron lens causing low aberration, and a super compact high-resolution charged particle beam apparatus using the electron lens.

In order to accomplish the above object, according to the present invention, a highly strong magnetic material such as a rare-earth cobalt magnet system or a neodymium-iron-boron magnet system is used to make a permanent magnet that is axially symmetrical and has a hole in the center thereof. An upper magnetic pole and a sample-side magnetic pole (lower magnetic pole) are magnetically connected to the respective poles of the permanent magnet. An inner gap opens on the side of the center axis, whereby a magnetic lens is axially formed. Furthermore, a semi-stationary magnetic path that partly shields an outside magnetic field and has a magnetic reluctance thereof regulated is disposed outside the permanent magnet. The sample-side magnetic pole and the magnetic path form a region where the magnetic reluctance is the highest outside the permanent magnet. Furthermore, a space defined by the permanent magnet, upper magnetic pole, sample-side magnetic pole, and semi-stationary magnetic path is filled with a filling made of a non-magnetic material, whereby an electron lens (objective lens) is realized.

Magnetic flux generated by the permanent magnet is distributed into an outer magnetic path and an inner magnetic path on the side of the center axis, and the axial magnetic field induced on the center axis determines the performance of a lens. The ratio of the portions of the magnetic flux distributed to the outer magnetic path and inner magnetic path is determined with the ratio of the magnetic reluctances offered by the respective magnetic paths. In the present invention, a very strong magnet, that is, a magnet generating a large magnitude of flux is employed in order to obtain a desired axial magnetic field that is strong enough, though the magnet is small-sized. The magnetic flux is distributed to the outer magnetic path to some extent.

Magnetic flux distributed to the outer magnetic path is leaked outside the magnetic substance to some extent, whereby a more compact electron lens can be realized. Since a portion of the outer magnetic path offering the highest magnetic reluctance is disposed on the side of a sample away from the center axis, outgoing leakage flux is generated on the side of a sample. Consequently, the leakage flux is so weak as to affect neither an electron beam nor any other apparatus. Owing to the lens structure of the present invention, a sufficiently strong axial magnetic field can be induced. Consequently, an objective lens offering a high resolution is realized.

Moreover, the objective lens structure has a merit that it can be used stably. This is because: a filling that is a non-magnetic substance works to increase magnetic reluctance; and even when the objective lens structure is entirely put in a vacuum sample chamber in order to prevent air inflow or outflow so as to prevent generation of a foreign matter by the magnet or external invasion of a foreign matter, a sample and other facilities will not be adversely affected. Furthermore, even when the magnetism of the permanent magnet varies due to a manufacturing step of magnetization, a temperature-dependent change, or a time-sequential change, a magnetic field can be regulated into a desired axial magnetic field owing to the semi-stationary magnetic path. Eventually, stable performance can be attained at a low cost.

Typical examples of the present invention will be described below.

(1) An electron lens that focuses an electron beam on a sample includes a permanent magnet being axially symmetric and having a hole in the center, and an upper magnetic pole and a sample-side magnetic pole which axially induce a magnetic field. The upper magnetic pole and sample-side magnetic pole are made of a soft magnetic material and magnetically coupled to the permanent magnet. The upper magnetic pole and sample-side magnetic pole axially forms a magnetic lens using a gap created between them near the center of the electron lens. A magnetic path made of a soft magnetic material and movable in axial directions or rotatable with an axis as a center of rotation is formed outside the permanent magnet, and the magnetic reluctance of the magnetic path outside the permanent magnet is regulative.

(2) An electron lens that focuses an electron beam on a sample includes a permanent magnet having a hole in the center thereof, being axially symmetrical, and exhibiting axially symmetric magnetism, and an upper magnetic pole and a sample-side magnetic pole which axially induce a magnetic field. The upper magnetic pole and sample-side magnetic pole are made of a soft magnetic material and magnetically coupled to the permanent magnet. The upper magnetic pole and sample-side magnet pole axially forms a magnetic lens using an inner gap created between them. An outer gap between the upper magnetic pole and sample-side magnetic pole is located outside the inner gap relative to the axis on the side of a sample. The outer gap borders the portion of an outer magnetic path, which routes the outside portion of magnetic flux generated by the permanent magnet, offering the highest magnetic reluctance. A space defined by the permanent magnet, upper magnetic pole, and sample-side magnetic pole is filled with a filling made of a non-magnetic material.

(3) In the electron lens set forth in (2), a magnetic path for use in regulating the magnetic reluctance of the outer magnetic path is disposed outside the permanent magnet as a means for regulating the axial magnetic field.

(4) In the electron lens set forth in (3), the magnetic path is shaped substantially like a cylinder, made of a soft magnetic material, and movable in axial directions. A locking means is included for locking the magnetic path relative to the electron lens.

(5) In the electron lens having the aforesaid components, an electrostatic electrode exerting an electrostatic lens effect is disposed in or near a place where the electrostatic electrode will be affected by the axial magnetic field induced by the magnetic lens.

(6) In the electron lens having the aforesaid components, the upper magnetic pole or sample-side magnetic pole is electrically segmented with an insulating substance between them. Part of the upper magnetic pole or sample-side magnetic pole is used as the electrostatic electrode.

(7) A charged particle beam apparatus includes an electron beam source, an electron optical system including an electron lens that focuses an electron beam radiated from the electron beam source on a sample, and a means for detecting, imaging, and displaying secondary electrons emitted from the sample. The electron lens includes a permanent magnetic being axially symmetrical and having a hole in the center thereof, and an upper magnetic pole and a sample-side magnetic pole that axially induce a magnetic field. The upper magnetic pole and sample-side magnetic pole are made of a soft magnetic material, and magnetically coupled to the permanent magnet. The upper magnetic pole and sample-side magnetic pole axially form a magnetic lens using a gap created between them near the center of the electron lens. A magnetic path made of a soft magnetic material and movable in axial directions or rotatable with an axis as a center of rotation is disposed outside the permanent magnet. The magnetic reluctance of the magnetic path outside the permanent magnet is regulative.

(8) A charged particle beam apparatus includes an electron beam source, an electron optical system including an electron lens that focuses an electron beam radiated from the electron beam source on a sample, and a means for detecting secondary electrons emitted from the sample, producing an image, and displaying the image. The electron lens includes a permanent magnetic having a hole in the center thereof, being axially symmetrical, and exhibiting axially symmetrical magnetism, and an upper magnetic pole and a sample-side magnetic pole that axially induce a magnetic field. The upper magnetic pole and sample-side magnetic pole are made of a soft magnetic material, and magnetically coupled to the permanent magnet. The upper magnetic pole and sample-side magnetic pole axially form a magnetic lens using an inner gap created between them. An outer gap between the upper magnetic pole and sample-side magnetic poles is located outside the inner gaps relative to the center axis on the side of a sample. The outer gap borders the portion of an outer magnetic path, which routes an outside portion of magnetic flux generated by the permanent magnet, offering the highest magnetic reluctance. A magnetic path made of a soft magnetic material and movable in axial directions is disposed outside the permanent magnet, and used to regulate the magnetic reluctance of the output magnetic path. A space defined by the permanent magnet, upper magnetic pole, and sample-side magnetic pole is filled with a filling made of a non-magnetic material.

(9) The charged particle beam apparatus having the foregoing components includes an ion beam optical system that focuses or deflects an ion beam radiated from an ion beam source on or onto a sample via an electrostatic objective lens. The electron optical system and ion beam optical system are put in the same vacuum chamber.

(10) In the charged particle beam apparatus set forth in (9), the electron lens included in the electron optical system has the inner gap, which is created between the upper magnetic pole and sample-side magnetic pole, oriented outside the axis. The ion beam optical system includes a magnetic field generating means located near the ion beam source beyond the electrostatic objective lens. Different trajectories are formed in association with different masses of ions. The trajectories traced by ions of different masses coincide with each other at a point on a sample or a focus due to a magnetic field induced by the electron optical system.

According to the present invention, there is provided a compact electron lens causing little aberration, and a charged particle beam apparatus such as an SEM that is super compact and offers a high resolution.

BRIEF DESCRIPTION OF THE DRAWINGS

These and other features, objects and advantages of the present invention will become more apparent from the following description when taken in conjunction with the accompanying drawings wherein.

DESCRIPTION OF THE PREFERRED EMBODIMENTS

Figure 1:
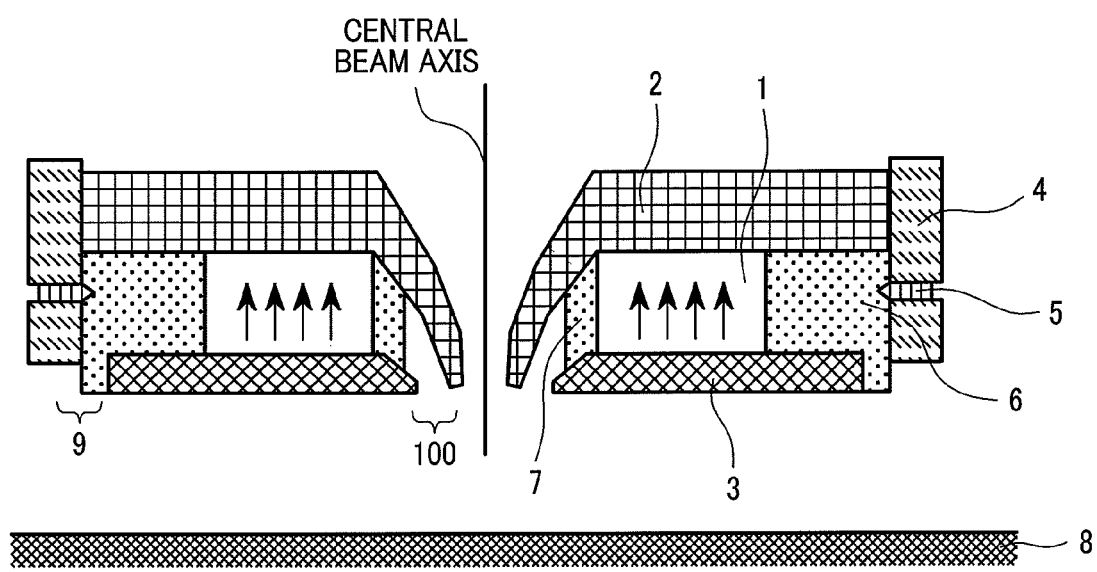
FIG. 1 is a sectional view showing an embodiment of an electron lens in accordance with the present invention.
Figure 2A:
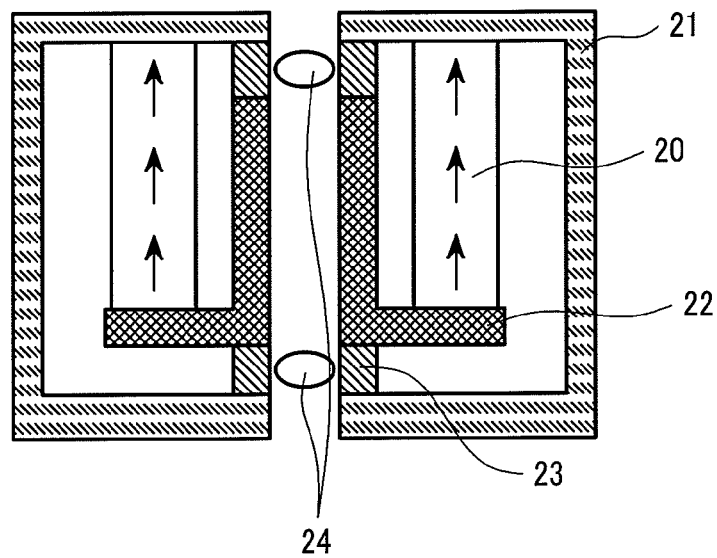
FIG. 2A to FIG. 2C are explanatory diagrams showing conventional electron lenses.
Figure 2B:
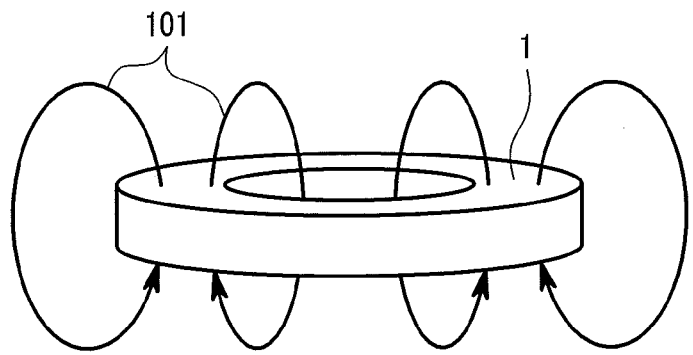
Figure 2C:
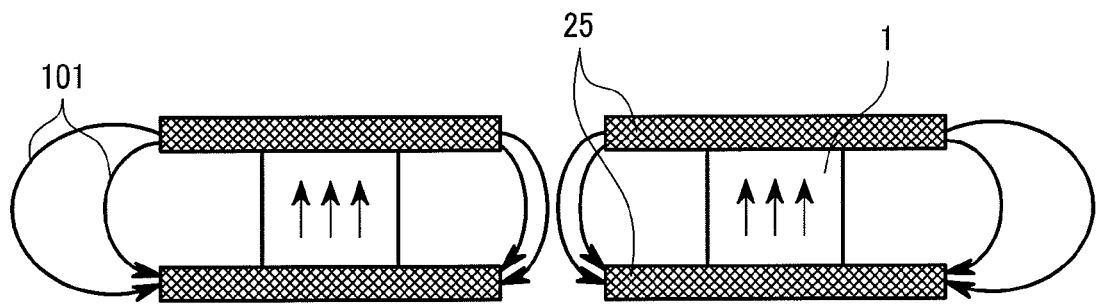

Referring to the drawings, embodiments of the present invention will be described below.

First Embodiment

FIG. 1 shows a cross section of a structure serving as an electron lens (compact objective lens) according to the first embodiment of the present invention. A permanent magnet 1 having a hole in the center thereof, having an axially symmetrical shape (doughnut shape), and exhibiting axially symmetrical magnetism is magnetized vertically in the drawing and has an upper magnetic pole 2 and a sample-side magnetic pole 3, which are made of a permalloy, attached to the respective poles thereof. An inner gap 100 created between the magnetic poles is oriented to a sample near the axis. Flux is generated in a vacuum from the gap, and an axial magnetic field is induced on the center axis of the lens structure on the side of a sample, that is, below the lens structure. The magnetic field functions as a magnetic lens. The peak of a magnetic flux density is on the order of 0.2 Tesla. A working distance (WD) ranges from about 2 mm to about 4 mm. The magnetic lens is optimal for an electron beam that gains energy of about 1 keV when falling on a sample, and can focus the electron beam with a resolution of about 2 nm.

Next, other components needed to attain the above performance will be described below. The inner wall and outer wall of the permanent magnet 1 are shielded with a filling 6 and a cover 7 that are made of aluminum (Al) and shaped like coaxial cylinders. The lens structure can therefore entirely be put in a vacuum sample chamber. Moreover, a semi-stationary cylindrical magnetic path 4 made of a permalloy is secured to the filling 6 using set screws 5. An outer gap 9 is created between an outer magnetic path that is the semi-stationary magnetic path 4 and the sample-side magnetic pole 3. The magnetic reluctance offered by the gap is regulated based on the position of the semi-stationary magnetic path 4 in order to optimize the axial magnetic field.

Herein, part of the upper magnetic pole 2 near the center axis is shaped like a funnel, and the inner diameter of the funnel part gets smaller towards a sample 8. The axial magnetic field exhibits a peak in the strength on the side of the sample beyond the lower end of the upper magnetic pole 2. Consequently, the focal length of the formed magnetic lens is very small. When the lens structure is employed especially in a low-voltage scanning electron microscope (SEM) which accelerates electrons to such an extent that the electrons gain kinetic energy ranging from 100 eV to 3 keV, the lens structure has a merit of having chromatic aberration thereof, which dominates a resolution, reduced. Moreover, since an outgoing leakage flux spreads from the outer gap towards the sample, the adverse effect thereof on the performance of an electron beam apparatus can be minimized.

Herein, the size of the permanent magnet 1 is such that the outer diameter thereof is 34 mm, the inner diameter thereof is 20 mm, and the height thereof is 5 mm. The diameter of the hole around the center axis of the upper magnetic pole 2 is 3 mm, and the thickness of the disk part of the upper magnetic pole is 5 mm. The inner diameter of the sample-side magnetic pole 3 is 12 mm, and the thickness of the disk part thereof is 3 mm. The thickness of the semi-stationary magnetic path 4 is 2 mm. The outer diameter of the entire lens structure is 50 mm, and the height thereof is 10 mm. These dimensions need not be limited to the presented numerical values but may be determined according to a required axial magnetic field and a desired shape after selection of a material to be made into the permanent magnet and soft magnetic materials to be made into the magnetic poles.

Figure 3A:
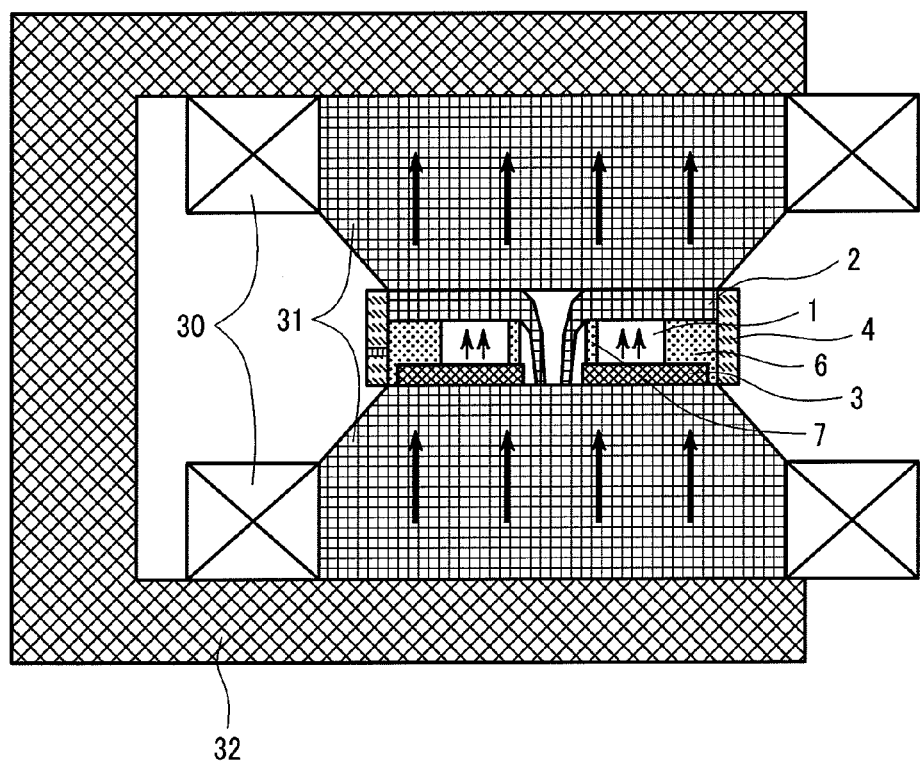
FIG. 3A and FIG. 3B are explanatory diagrams showing manufacturing processes of an electron lens in accordance with the present invention.

As for a manufacturing process, first, a sintered substance prepared from a ferromagnetic material such as a samarium-cobalt system alloy, which is not magnetized and made into the cylindrical permanent magnet 1 and other components, the upper magnetic pole 2, the sample-side magnetic pole (lower magnetic pole) 3, the outside magnetic path 4, the cover 7, and the filling 6 are molded, processed, and then assembled. The resultant assembly is put in a magnetizer 32 like the one shown in FIG. 3A. As shown in FIG. 3A, a current flows through magnetizing coils 30 in order to generate flux between pole pieces 31, whereby the ferromagnetic material is magnetized in order to produce the permanent magnet 1. In this case, if the magnetic flux densities in the portions of the pole pieces 31 linked by a soft magnetic material are higher than the saturation flux density of the material made into the pole pieces, 31 inhomogeneous magnetization caused by absorption of flux can be prevented. Otherwise, the shape of the pole pieces 31 may be changed from a flat plate shape and may be dented near the center axis in order to form a region where a large magnetic reluctance is offered. After completion of magnetization, the upper magnetic pole 2, the sample-side magnetic pole 3, and the magnetic path 4 are attracted to one another due to magnetizing force. There is no fear that any component may come off or the assembly may be disassembled. Moreover, the components may be secured in advance using an adhesive or screws in order to immobilize the components that are not magnetized or in case strong force may be imposed on the magnetized components to cause the magnetized components to come off. Otherwise, in order to immobilize the components that are not magnetized, the permanent magnet 1 may be magnetized weakly so that the magnetic flux density will be about 10% of the saturation flux density thereof, and used to adsorb the components with the weak force.

Incidentally, the magnetized permanent magnet 1 may be used for assembling. However, attraction derived from magnetism gets abruptly stronger with approach of a magnetic substance. Utmost care should be taken that any component is not cracked due to impact occurring during assembling, an assembling error does not occur, or a worker is not injured.

Moreover, the magnetic path 4 may not be included in the assembly prior to magnetization but may be included therein after completion of magnetization. The shape of the pole pieces 31 may be properly modified according to a lens structure. For example, when the top of the upper magnetic pole 2 or the sample side of the sample-side magnetic pole 3 are conical, the pole pieces are shaped accordingly conically. Moreover, the filling 6 and cover 7 may be formed by pouring a resin, which is not cured, after completion of assembling or magnetization, and then curing the resin. In this case, the resultant filling 6 and cover 7 will closely adhere to the permanent magnet 1.

Thereafter, aging or annealing is performed in order to suppress a temperature -dependent change in the magnetism of the permanent magnet 1. The aging or annealing is intended to eliminate in advance an irreversible change that is a component of a temperature -dependent change in the magnetism of the permanent magnet so as to suppress a variation in the magnetism occurring during use. The aging or annealing should be determined based on a material made into the permanent magnet, a working temperature, and the permeance of the permanent magnet. Assuming that a samarium-cobalt system is adopted as a material to be made into a magnet, since the Curie temperature is as high as about 800° C., the magnet can be used even in a place where it may be heated to high temperature. For example, if the magnet is heated to 400° C., the magnet should be annealed for about one hour at 450° C. after being magnetized. This stabilizes the magnetism of the magnet. In this case, the filling 6 and cover 7 should preferably withstand heat and therefore be made of a copper alloy, a titanium alloy, or an austenite system stainless steel. Moreover, assuming that a neodymium-iron-boron system is adopted as a ferromagnetic substance, since the Curie temperature is low, the application of the magnet should be limited to usages at 200° C. or less. Preferably, heat treatment of the magnet should be performed at 150° C. or less, and the magnet should be used at 100° C. or less. Moreover, a permeance coefficient varies depending on the shape of the permanent magnet 1. Assuming that the permanent magnet 1 has a small width in a magnetizing direction and is elongated, a permeance is large, and a change in flux caused with a change in temperature or a variation in an external magnetic field is limited. The permanent magnet having such a shape would prove effective in a case where a large space can be preserved in design. On the other hand, when the permanent magnet has a large width and is short, that is, shaped like a thin doughnut, a permeance is small and flux is likely to change. This should be taken into consideration in designing the doughnut-shaped magnet.

Figure 3B:
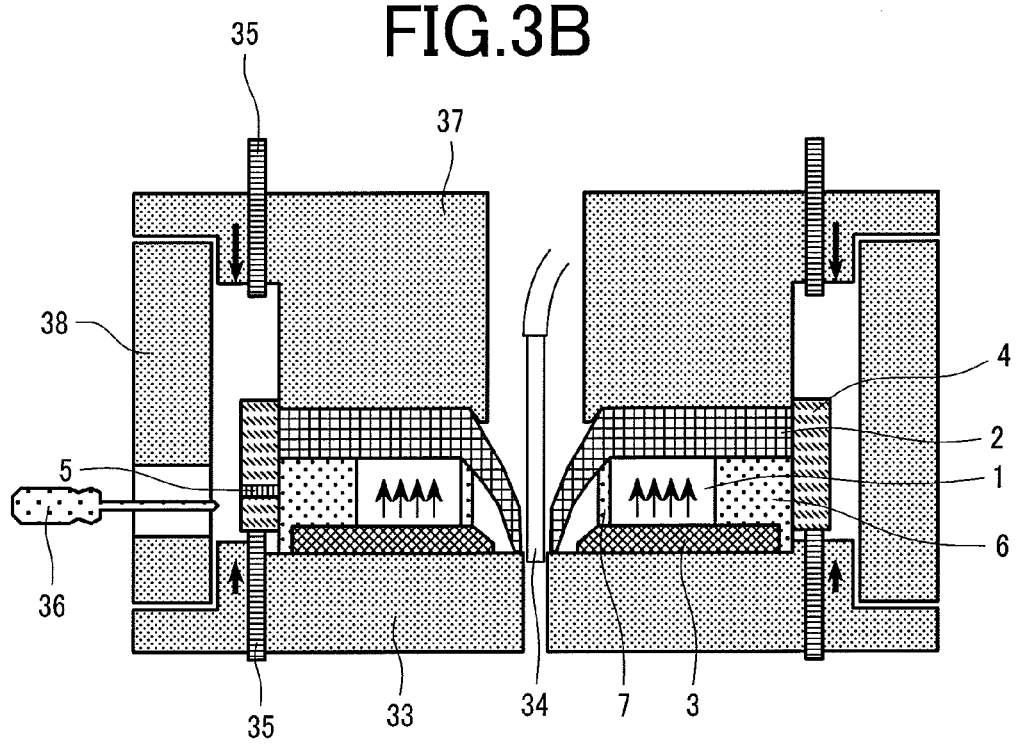

Since the flux in the magnetized permanent magnet 1 varies, a trimmer 38 like the one shown in FIG. 3B is used to maintain a desired characteristic. The components of the trimmer have to be made of a non-magnetic material, for example, a hard resin, a ceramic, glass, an aluminum alloy, austenite system stainless steel, or a titanium alloy. If a smaller and harder trimmer is needed, the components thereof are made of molybdenum or the like. The magnetized or annealed electron lens structure in accordance with the present invention is locked between the cap 37 and base 33 of the trimmer. A magnetic field measuring instrument 34 is used to measure the strength of an axial magnetic field. The position of the magnetic path 4 is adjusted using trimmer rods 35 so that the measured value will be equal to a desired value. Thereafter, a screwdriver 36 is used to tighten a lock screw 5. The trimmer rods 35 are disposed above two or more positions on the magnetic path 4, and equally moved down by means of screws or plates in order to move the magnetic path 4 downward. For moving the magnetic path 4 upwards, the trimmer rods 35 that are moved up from the base 33 are used. Herein, the bars are used to vertically move the magnetic path 4. Alternatively, plates or cylinders may be employed because any means capable of moving the magnetic path 4 is equally advantageous.

Figure 4A:
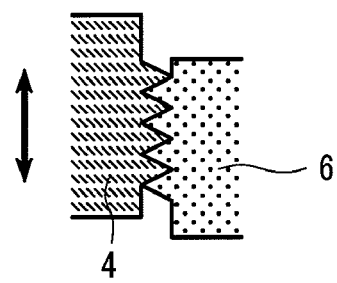
FIG. 4A to FIG. 4F are explanatory diagrams concerning a method of regulating a magnetic field in the electron lens in accordance with the present invention.
Figure 4B:
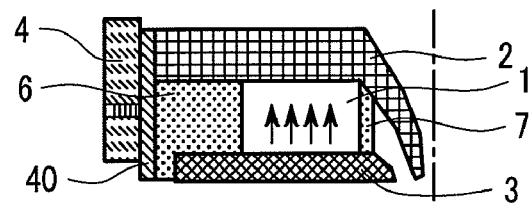

For regulation of a magnetic field, the adoption of any means or structure for movement of the magnetic path 4 is apparently equally advantageous. For example, as shown in FIG. 4A, the internal surface of the magnetic path 4 and the periphery of the filling 6 may be threaded so that the magnetic path 4 will be movable in axial directions. In this case, since the vertical position of the magnetic path 4 can be determined by turning the magnetic path 4, an axial magnetic field can be regulated to have desired strength. Moreover, the magnetism of a soft magnetic material such as permalloy made into the upper magnetic pole 2 changes with a stress or distortion. Therefore, as shown in FIG. 4B, a cover 40 should be employed in order to prevent non-uniform deterioration derived from friction occurring during regulation. The adoption of a resin material such as Teflon® or Vespel® as a material to be made into the cover 40 has the merit of minimizing friction against the outside magnetic path 4.

Figure 4C:
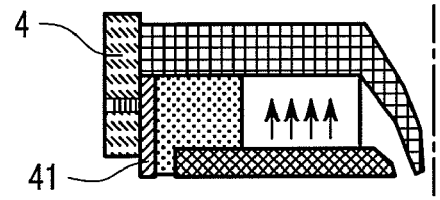

In the present embodiment, the semi-stationary magnetic path 4 is a magnetic substance that undergoes magnetic flux outside. Alternatively, as shown in FIG. 4C, another peripherally stationary magnetic path 41 may be included. The peripherally stationary magnetic path 41 is shaped like a thin cylinder because it is used in magnetic saturation or a similar condition. In this case, since a range in which an axial magnetic field is regulated using the semi-stationary magnetic path 4 is narrowed, higher-precision regulation can be readily achieved.

Figure 4D:
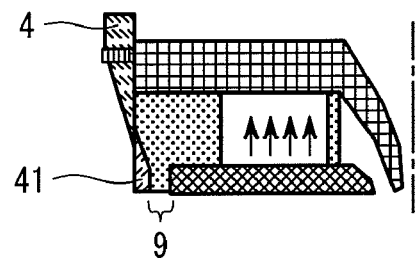

Moreover, the sectional shapes of the semi-stationary magnetic path 4 and peripherally stationary magnetic path 41 are rectangular. Alternatively, any shape may be adopted as long as the magnetic path 4 remains movable. For example, as shown in FIG. 4D, a wedge-like sectional shape will do. In this case, the magnetic reluctance of the outer gap 2 is fixed, and the magnetic reluctance of the magnetic path 4 is regulated with a portion thereof bordering the peripherally stationary magnetic path 41.

Figure 4E:
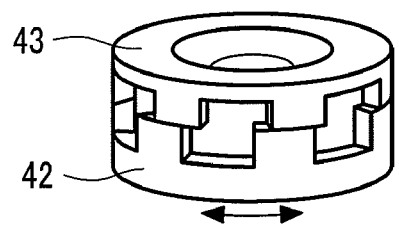
Figure 4F:
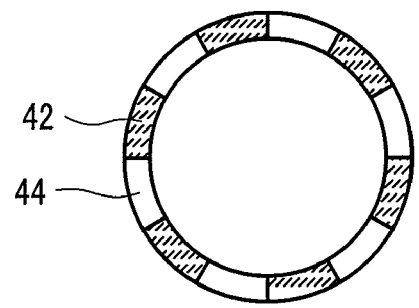

Moreover, when the magnetic reluctance of the outside magnetic path should be variable, an axially symmetrical structure may not necessarily be adopted. For example, as shown in FIG. 4E, a saw tooth trimmer magnetic path 42 and a saw tooth magnetic path 43 may be combined, and the saw tooth trimmer magnetic path 42 may be designed to be rotatable with an axial as a center of rotation. Moreover, as shown in FIG. 4F, the open portions among the teeth of a sawtooth magnetic path structure may be filled with a non-magnetic filling 44. In this case, the magnetic path structure has a cylindrical appearance.

Figure 5A:
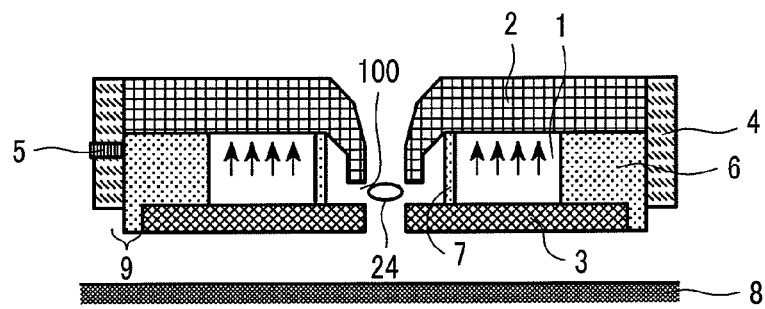
FIG. 5A to FIG. 5E are explanatory diagrams showing other examples of the electron lens in accordance with the present invention.

The present embodiment has been described on the assumption that an objective lens is of a type realized with a magnetic lens whose center is located on the side of a sample beyond the sample-side magnetic pole 3. Alternatively, as shown in FIG. 5A, a lens structure having an inner gap 100 is interposed between an upper magnetic pole 2 and a sample-side magnetic pole 3 is feasible. In this case, an electron lens 4 is attained in the middle of the inner gap 100 on the center axis of the structure, and disposed inside the lens structure. The lens structure is characterized in that magnetic leakage outside the lens along the center axis, or especially, magnetic leakage towards a sample is quite limited. The lens structure would prove useful when applied to observation of a sample that is a magnetic substance susceptible to a magnetic field or to a case where another electron beam is irradiated obliquely or the lens structure coexists with an ion beam column.

Moreover, in the present lens structure, magnetic reluctance exerted on the axial side of the upper magnetic pole 2, that is, inside the upper magnetic pole 2 is quite limited. Compared with the electron lens shown in FIG. 1, the magnetic flux generated by the permanent magnet 1 and needed to obtain an axial magnetic field of the same strength can be reduced. Moreover, the magnetic reluctance of the outside magnetic path can be reduced. This leads to the merit that an objective lens structure can be designed compactly. The lens structure is therefore suitable for high-resolution observation to be performed under a condition that a sample is observed nearby at a short working distance (WD) or observation in a place where there is no spatial room. For example, for induction of a magnetic field of the same strength as the magnetic field induced in the structure shown in FIG. 1, that is, a magnetic field having strength of about 0.2 T, a lens structure may be designed so compactly that its outer diameter ranges from about 30 mm to about 10 mm.

Figure 5B:
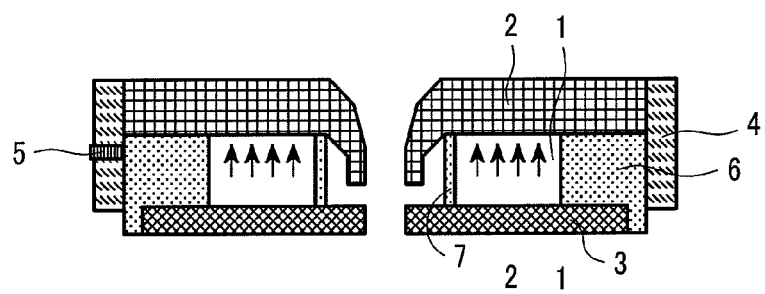

Furthermore, since the present lens structure can have the internal magnetic reluctance thereof reduced, it may not have the outer gap 9 or may have, as shown in FIG. 5B, the upper magnetic pole 2 and sample-side magnetic pole 3 joined externally. In this case, the peak of the strength of an axial magnetic field induced in the center ranges from 0.7 T to 0.1 T in practice. A magnetic field strength suitable for an acceleration voltage ranging from 10 kV to 1 kV should be selected. For application to electrons accelerated with a high acceleration voltage of about 30 kV, the permanent magnet 1 and the outer circumference of the magnetic path should be made larger.

Figure 5C:
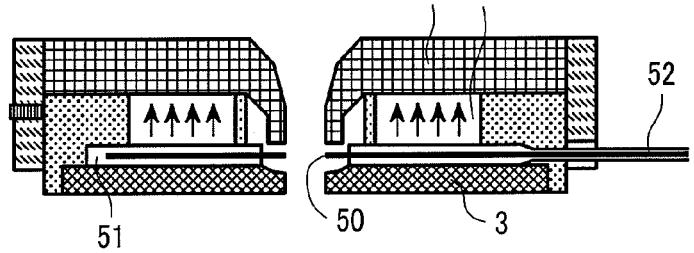

Compared with a lens realized using coils, an electron lens realized using a permanent magnet has the merit of being quite stable and causing no noise. However, when the permanent magnet is adopted, a magnetic field strength remains constant and is hard to change. Therefore, the electron lens cannot be applied to a case where an acceleration voltage or the height of a sample varies or a focal point is finely changed for automatic focusing. One approach to this problem is to conduct electricity to a superimposed coil for the purpose of slight regulation. Another approach is a combination with an electrostatic lens. For example, as shown in FIG. 5C, an electrostatic electrode 50 providing an electrostatic lens effect may be interposed between the upper magnetic pole 2 and sample-side magnetic pole. The electrostatic electrode 50 sheathed with an shield wire 52 is interposed between the permanent magnet 1 and the sample-side magnetic pole 3, and the center axis side of the electrostatic electrode 50 is bared. The electrostatic electrode 50 is made of a conducting non-magnetic material such as phosphor bronze, an austenite stainless steels, or a titanium alloy. A voltage is externally applied to the electrostatic electrode over the shield wire 52. In this structure, when the potentials at the upper magnetic pole 2 and sample-side magnetic pole 3 are identical to each other, an electrostatic lens of an einzel type is overlapped on the electron lens by varying the potential at the intermediate electrostatic electrode 50. In case the acceleration voltage of an electron beam or the position of a sample changes, the change can be coped with by varying the voltage to be applied to the electrostatic electrode 50.

When an automatic focusing facility is employed, a focal point can be quickly changed by applying a high-frequency voltage to the electrostatic electrode 50. In particular, when a lens is realized using coils, the quickness in the change is limited because of the inductance caused by the coils. In the present lens structure, quick response performance is determined only with the stray capacitance caused by the electrostatic electrode 50. Focusing can be achieved more quickly. The frequency of the applied voltage may be about several tens of megahertz as long as the electrostatic electrode 50 is designed compactly.

Another merit of the present lens structure is that a change in a focus is unaffected by hysteresis. In an electron lens structure which uses coils and in which a magnetic field is varied, since the intermediate magnetic path exhibits hysteresis represented by a hysteresis loop, electrons are converged at different focal points despite the same magnetizing current. For this reason, automatic focusing is hard to do under an observational condition requesting high precision or a high resolution. This poses a problem in that an apparatus including such lens structure is not user-friendly and expertise is needed for observation. In contrast, according to the present invention, a magnetic lens is accurately constant in performance, and only a condition for an electrostatic lens can be fully independently and highly precisely modified while being unaffected by hysteresis. Automatic focusing ensuring high precision and a high resolution can be attained.

Figure 5D:
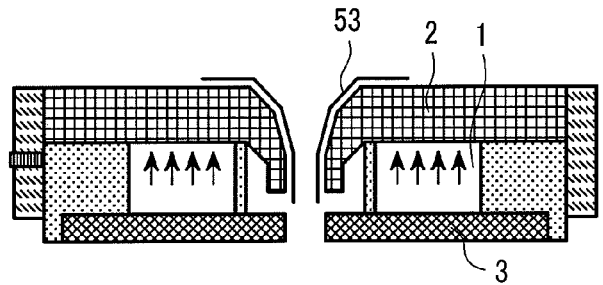

The approach that an electrostatic lens effect is superimposed would be equally advantageous. For example, as shown in FIG. 5D, an upper electrostatic electrode 53 may be disposed above the upper magnetic pole 2 so that an opening will be created near the inner gap 100. Thus, a bipotential electrostatic lens may be overlapped on the electron lens. In this case, a simple lens structure can be manufactured inexpensively. Furthermore, if a positive high voltage ranging from several hundreds volts to about 10 kV is applied to the upper electrostatic electrode 53, an electron beam can be accelerated. Consequently, chromatic aberration caused by a magnetic lens can be minimized and a high resolution can be attained. A scanning electron microscope (SEM) offering a resolution of about 2 nm can be constructed.

Figure 5E:
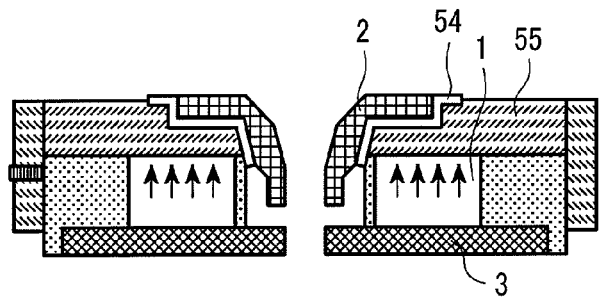

Moreover, a magnetic pole may also be used as an electrostatic electrode. For example, as shown in FIG. 5E, the upper magnetic pole 2 may be isolated from a fixed magnetic path 55 using an insulating substance 54, and another voltage may be applied to the upper magnetic pole 2 in order to overlap an electrostatic lens on an electron lens. This structure is equally advantageous. The same applied to a case where the sample-side magnetic pole is isolated. Herein, the insulating substance 54 may be an insulating material such as a ceramic or a resin. When a strong magnetic field is needed, if a soft ferrite offering high electric resistance such as a manganese zinc ferrite is adopted as the insulating substance 54, the magnetic reluctance of the magnetic path can be effectively minimized.

A focus can be changed by combining an electrostatic lens with a magnetic lens. For example, the semi-stationary magnetic path 4 may be removed from the structure shown in FIG. 5B in order to employ a structure having all magnetic paths made stationary. Although the property of the magnetic lens may vary each time, if the electrostatic lens is used to correct the property, the same focal point can be obtained. The lens structure has a merit of being manufactured inexpensively.

Figure 6A:
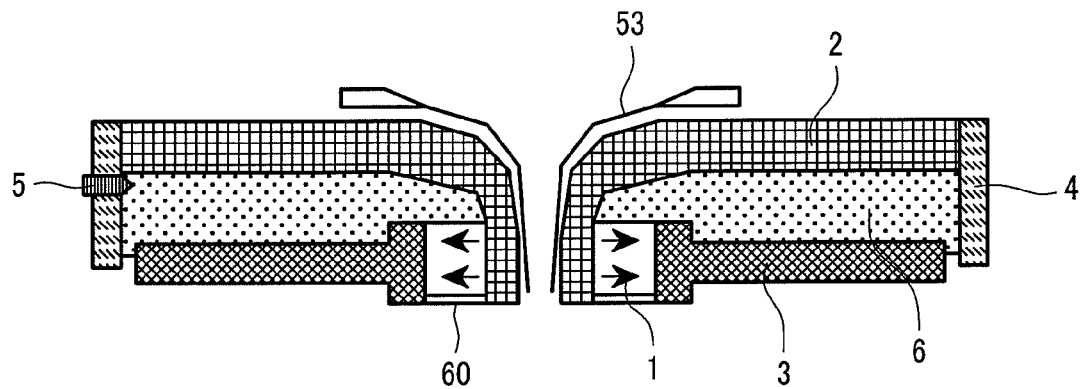
FIG. 6A to FIG. 6C are explanatory diagrams showing still other examples of the electron lens in accordance with the present invention.

In the present embodiment, the magnetizing direction of the permanent magnet 1 is the direction of an axis of symmetry. In practice, an axial magnetic field used as a magnetic lens is determined with the position of an inner gap or the orientation thereof. The magnetizing direction may be any other direction as long as the direction permits induction of the axial magnetic field. For example, as shown in FIG. 6A, the permanent magnet 1 may be magnetized in radial directions, that is, the cylindrical permanent magnet 1 may be magnetized so that the internal surface and external surface thereof will serve as a south pole and a north pole respectively. The upper magnetic pole 2 is magnetically coupled to the internal cylindrical surface, and the sample-side magnetic pole 3 is magnetically coupled to the external cylindrical surface. In this case, an inner gap is oriented toward a sample. Similarly to the structure shown in FIG. 1, a magnetic lens is formed as an axial magnetic field that exhibits a peak in strength on the side of a sample. Herein, since the magnet 1 can be approached to the sample, a small magnetic will do. The adoption of a strong magnet offering a magnetic flux density of about 1 T and being made of a neodymium-iron-boron system would realize a more compact lens. Since magnet materials including the neodymium-iron-boron (Nd—Fe—B) system are prone to intergranular corrosion, a coated layer 60 should be formed in order to protect the surface of the magnet at the same time. Otherwise, a samarium-cobalt system magnet may be adopted. In this case, the magnetic flux density is weaker by about 30%. However, since the Curie temperature is as high as about 800° C., the magnet is suitable for applications in which the magnet is exposed to high temperature. Even in this case, the cover realized by the coated layer 60 would prove effective in preventing dilation or intergranular cracking derived from gas adsorption by a samarium-cobalt material.

When a column is tilted at a large angle with respect to a sample for the purpose of high-resolution observation, the center-axis side of the upper magnetic pole 2 should be further thrust out toward the sample. For example, a structure like the one shown in FIG. 6B would prove effective. Specifically, the structure is tilted above a flat sample such as a silicon substrate and then approached to the sample. Since the magnetic lens can thus be approached to the vicinity of the sample, high-resolution observation can be achieved. Moreover, when magnetic leakage has to be avoided, the center-axis side of the sample-side magnetic pole 3 should be, as shown in FIG. 6C, thrust out toward a sample beyond the upper magnetic pole 2.

Second Embodiment

Figure 7:
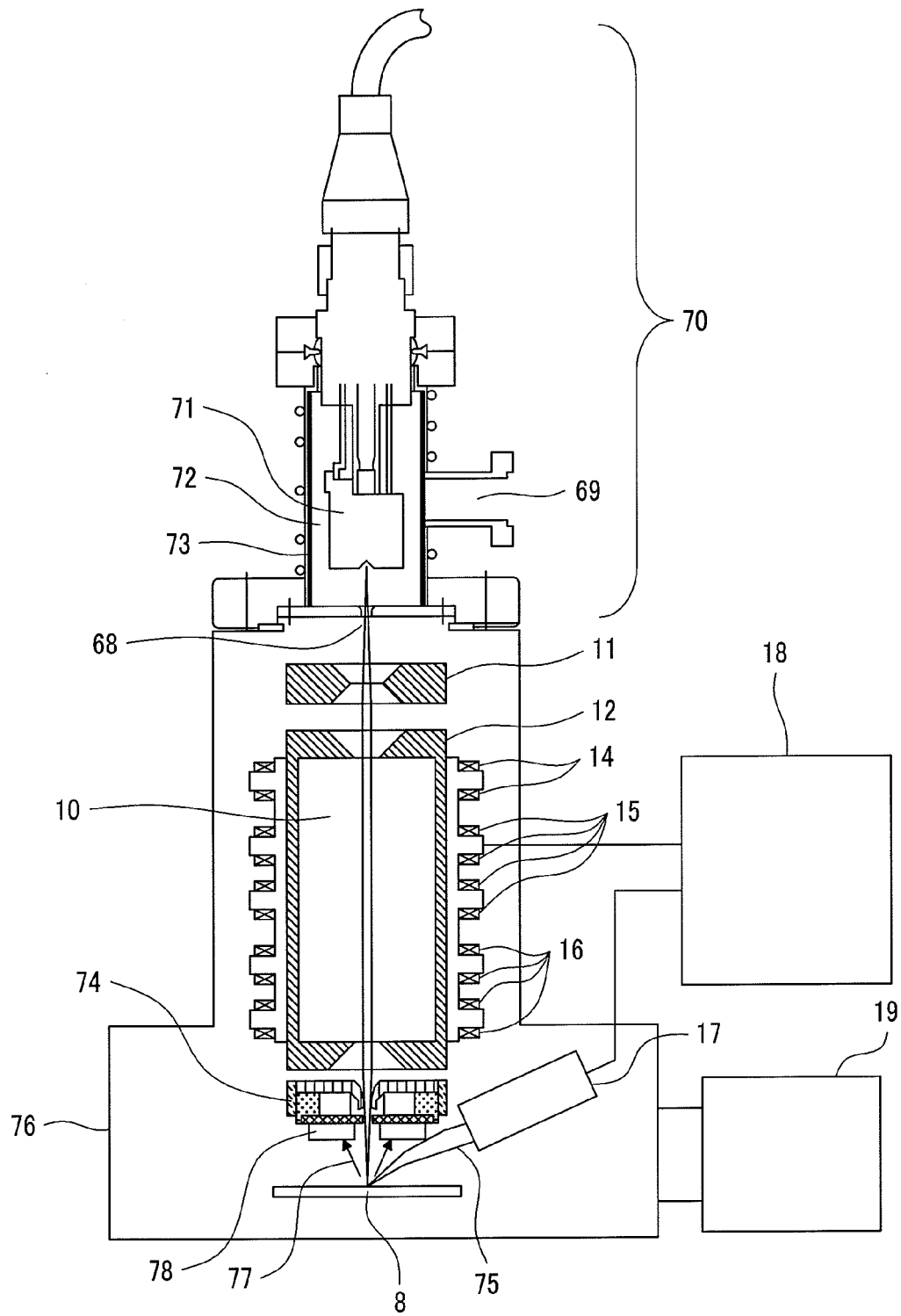
FIG. 7 is an explanatory diagram showing a second embodiment of the present invention.

FIG. 7 shows the second embodiment of the present invention implemented in a compact electrostatic column in order to attain a high resolution.

Herein, an electron gun 70 is exhausted using a sheet-type non-evaporable getter pump 72, which is disposed inside, instead of an ion pump. This is intended to employ a high-performance Schottky electron beam source 71 and attain a compact design. The outer diameter of the electron gun 70 including the pump is as small as 70 mm or less. For startup, a vacuum pipe is extended from a rough exhaust port 69 and coupled to a turbo molecular pump 19. After the electron gun is exhausted to somewhat create a vacuum therein, a heater 73 disposed on the external wall thereof is used to heat or activate the non-evaporable getter pump 72. Thereafter, the rough exhaust port 69 is sealed with a valve. Consequently, the interior of the electron gun 70 is retained in a super vacuum atmosphere. Heating conditions for activation are such that the non-evaporable getter pump 72 is heated at a heating temperature ranging from 350° C. to 700° C. for one hour or more when being made of a zirconium-vanadium system. Moreover, for maintenance of a super vacuum, the diameter of an aperture 68 in a partition between the electron gun 70 and a vacuum chamber 76 through which an electron beam 10 passes is made so small as to range from 30 µm to 100 µm in order to restrict the inflow of gas.

A control electrode 11, a drift tube 12, and a magnetic objective lens 74 in accordance with the present invention are put in the vacuum chamber 76 which is exhausted by the turbo molecular pump 19. The magnetic objective lens 74 has the structure shown in FIG. 5A. A permanent magnet 1, an upper magnetic pole 2, and a sample-side magnetic pole 3 have a thickness of 1 mm. The thickness of the magnetic objective lens 74 is 3 mm, the diameter thereof is 4 cm, and the diameter of a hole thereof is 0.8 mm. A positive high voltage is applied to each of the control electrode 11 and drift tube 12. The top of the drift tube 12 and the control electrode 11 form an electrostatic lens that serves as a condenser lens. Moreover, an electrostatic lens is formed between the bottom of the drift tube 12 and the magnetic lens 74 brought to the ground potential. The electrostatic lens and the underlying magnetic lens 74 constitute an objective lens. A stigma coil 14, an alignment coil 15, and a beam deflector 16 are placed on the periphery of the drift tube. Electrons emitted as a secondary of an electron beam 10 irradiated to a sample 8, that is, secondary electrons 75 are detected by a secondary electron detector 17 disposed nearby. Moreover, backscattered electrons 77 are so high in an energy level that they are detected by a backscattered electron detector 78 disposed on the bottom of the objective lens 74. A scanning electron microscopic image is displayed on an image formation means 18 according to the detected signals and a scan signal sent to the beam deflector 16.

Herein, a positive high voltage is applied to the drift tube 12 in order to accelerate the electron beam 10 inside, and the electron beam 10 is decelerated in the objective lens. For example, assuming that an amount of energy gained by the electron beam 10 at the ground potential is 1 electronvolt (keV), a voltage of about 5 kV is applied to the drift tube 12 and a voltage ranging from 800 V to 1200 V is applied to the control electrode 11. The electron beam in the drift tube is regulated so that it will be a parallel-ray beam. Assuming that the distance between the holes in the electrodes included in the electrostatic objective lens is 5 mm and the diameter thereof is 0.8 mm, when the permanent magnet 1 is not magnetized yet, the electron beam is focused on a place separated by approximately 5 mm from the bottom of the objective lens 74. In other words, the working distance is 5 mm. At this time, a resolution is on the order of 13 nm. On the other hand, when the permanent magnet is magnetized and the magnetic objective lens 74 having an axial magnetic field thereof regulated to correspond to the one induced at the magnetic flux density of about 0.1 T is employed, the working distance ranges from 2 mm to 3 mm and a formed scanning electron microscopic image exhibits as high a resolution as about 3 nm. In this case, a focal point is adjusted with the voltages to be applied to the drift tube 12 and control electrode 11 respectively. The present embodiment permits a high resolution despite a very compact design, and has the merit of being usable while placed on a desktop or another apparatus.

If the vacuum chamber 76 is kept vacuum all the time, scanning electron microscopic observation can be performed. The inclusion of another vacuum introduction chamber and the adoption of a load and lock method would be useful in exchanging the sample 8 with another. Moreover, the Schottky electron beam source 71 is adopted as an electron beam source. Alternatively, a tungsten (W) field emission source may be adopted. In this case, a smaller structure than the structure including the electron gun 70 is realized. For applications that do not require a very high resolution, a lanthanum hexaboride (LaB6) filament or a tungsten (W) filament may be heated. Moreover, although an example of conditions is adaptable to a case where electrons are accelerated with a low acceleration voltage of about 1 kV, the conditions are also adaptable to a case where electrons are accelerated with a higher acceleration voltage. In this case, chrominance aberration is reduced and a higher resolution is therefore attained.

Figure 8A:
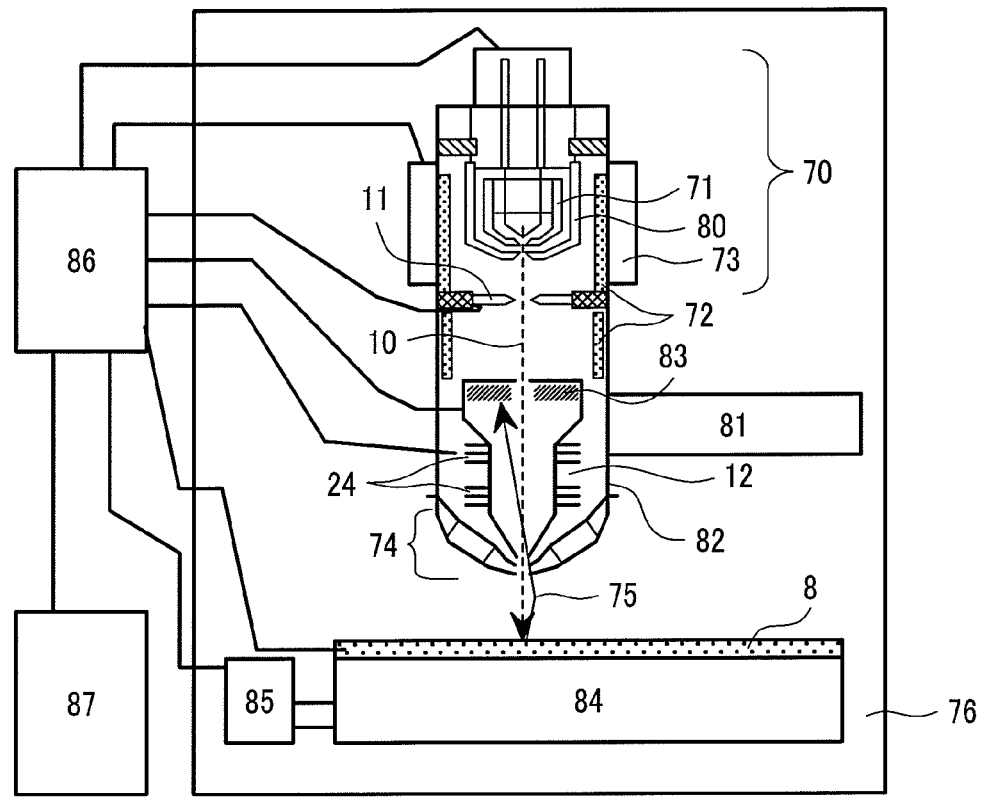
FIG. 8A to FIG. 8C are explanatory diagrams showing a variant of the second embodiment.

If an electrostatic lens and a compact electron gun 70 are combined and put in a vacuum chamber, a scanning electron microscope (SEM) column can be used as a movable column. For example, as shown in FIG. 8A, an SEM is designed to have a diameter of 70 mm or less, or preferably, a diameter of about 40 mm, and a moving means 81 is used to move the SEM over the sample 8. In this case, if the sample 8 is a panel to be included in a large-size flat panel display or a large-size semiconductor substrate, since the sample need not be moved, an apparatus can be designed compactly.

Furthermore, the SEM column may be tilted or multiple SEM columns may be juxtaposed in order to construct one system. An apparatus or a system useful in observing a three-dimensional structure, an edge of a wafer, or a side wall thereof can be constructed. In the SEM column shown in FIG. 8A, an electron gun 70 including a Schottky electron beam source 71 has a extractor electrode 80 and a non-evaporable getter pump 72 incorporated therein and has a heater 73, which is used to activate the pump, disposed on the periphery thereof. A housing 82 accommodating the entire SEM column is put in a vacuum chamber 76 and is therefore free from atmospheric pressure. The housing can be made thin and small in size. An electron optical system includes a control electrode 11, a drift tube 12, a magnetic objective lens 74, and a deflector 24 similarly to the one shown in FIG. 7. The electron optical system also includes a stigma coil and an alignment coil similarly to the one shown in FIG. 7, though the coils are not shown in FIG. 8.

In the apparatus shown in FIG. 8A, a negative voltage ranging from −100 V to −400 V is applied to the sample 8. Secondary electrons 75 emitted from the sample 8 to which an electron beam 10 is irradiated passes through the hole of the objective lens 74, and are detected by a built-in electron detector 83 of the drift tube 12. In this structure, since the SEM column and detector are integrated into one unit, the apparatus can be designed as a compact system. The structure is therefor optimal for a system in which the moving means 81 is used to move the SEM column or a system having multiple columns juxtaposed. Now, reference numeral 84 denotes a sample stage on which the sample is mounted, reference numeral 85 denotes a stage controller that controls a sample stage 84, reference numeral 86 denotes a controller for use in controlling the electron optical system incorporated in the SEM column and the stage controller 85, and reference numeral 87 denotes a display.

Figure 8B:
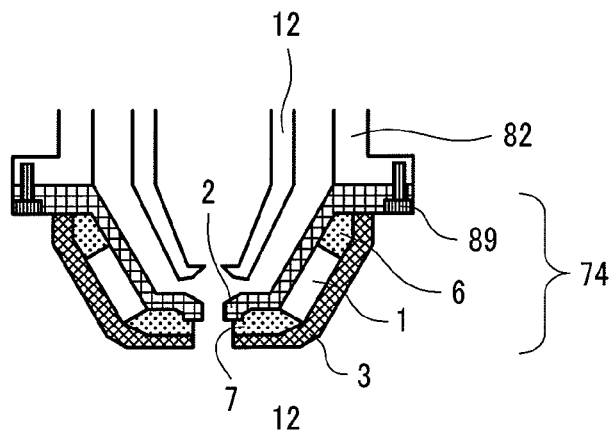

An objective lens structure included in the foregoing apparatus has, as shown in FIG. 8B, a magnetic lens located below an electrostatic lens in the same manner as the one shown in FIG. 7. The magnetic objective lens 74 is fixed to the housing 82 with bolts 89.

Figure 8C:
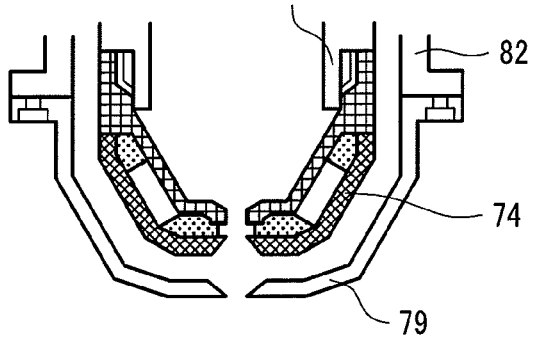

The magnetic objective lens 74 may be fixed to a sample-side end of the drift tube 12. For example, when the apparatus is used in a non-spacious place, part of the drift tube and part of the magnetic objective lens may be, as shown in FIG. 8C, threaded and engaged with each other. In this objective lens structure, electrons in the drift tube are accelerated to such an extent that an amount of kinetic energy gained by the electrons will range from 3 keV to 10 keV. Since the electrons pass through the magnetic lens at a high velocity, chrominance aberration can be minimized. A sample-side electrode 79 is brought to 0 V in order to decelerate the electrons and focus the electrons on a sample. Thus, the sample can be observed with a high resolution. When the working distance is about 2 mm and the amount of energy incident on the sample is about 1 keV, a resolution of about 2 nm is attained.

Third Embodiment

Figure 9:
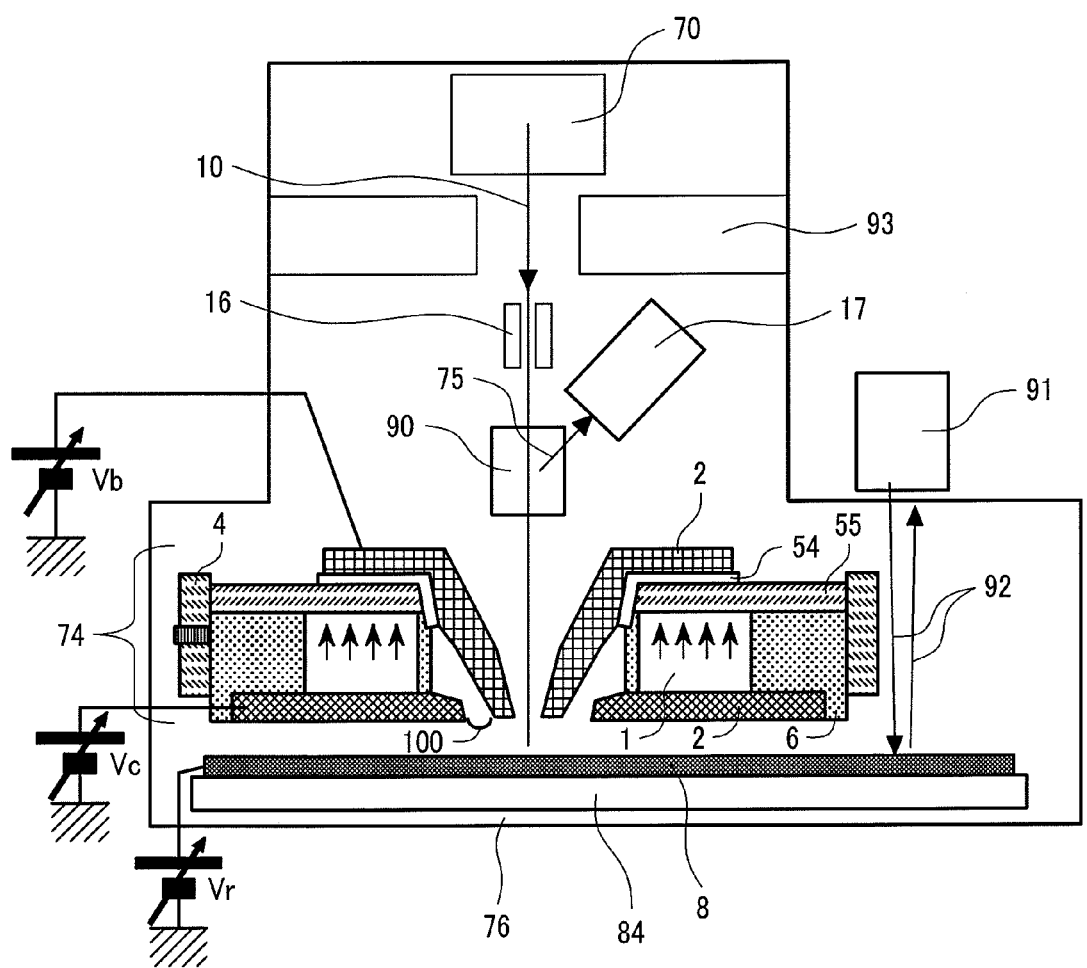
FIG. 9 is an explanatory diagram showing the third embodiment of the present invention.

FIG. 9 shows the configuration of the third embodiment of the present invention.

Illustrated is an apparatus suitable for observing as a sample 8 a wiring pattern in a semiconductor substrate or the shape of a hole therein. An electron beam 10 generated by an electron gun 70 employing a Schottky electron beam source is narrowly converged by a condenser lens 93 realized with a magnetic field and a magnetic objective lens 74 in accordance with the present invention, and irradiated to the sample 8. The electron beam 10 is swept by a beam deflector 16. An ExB filter 90 is disposed above the objective lens 74. The ExB filter 90 is designed to apply an electric field and a magnetic field orthogonally to each other and to the axis, and to regulate the electron beam 10 so that the electron beam 10 will advance rectilinearly. The ExB filter 90 bends the trajectory of passing electrons that is low in an energy level. Assuming that an amount of energy gained by the electron beam 10 at the ground potential is about 3 keV and a retarding voltage Vr to be applied to the sample 8 is about 2 kV, an amount of energy gained by the electron beam 10 incident on the sample is about 1 keV. In contrast, assuming that a boosting voltage Vb is applied to the upper magnetic pole 2 and an amount of kinetic energy gained by the electron beam 10 passing through the objective lens ranges from 10 keV to 5 keV, a small focus is formed on the sample 8 with chromatic aberration, which is caused by the objective lens, suppressed, and a resolution of about 2 nm is attained.

Secondary electrons 75 emitted from the sample are accelerated in an electric field induced by a voltage Vb−Vr, pass through the objective lens due to the magnetic field realizing the objective lens 74, and then enters the ExB filter. Herein, since an amount of energy gained by the secondary electrons 75 is so small as to range from Vr eV to Vr+10 eV, the secondary electrons are bent sideways by the electron beam 10 serving as a probe, and then detected by a secondary electron detector 17. Herein, since the secondary electrons emitted from deep holes in the surface of the sample 8 are accelerated by the electric field induced by the voltage Vb−Vr, information on the dimensions or shape of a deep hole whose aspect ratio is 10 or more can be acquired. Moreover, a sample-side magnetic pole 2 is normally retained at the ground potential. If necessary, a voltage Vc ranging from +300 V to −300 V may be applied to the sample-side magnetic pole. This is intended to control the charging potential on the surface of the sample 8. Consequently, negative or positive charging can be selected in order to acquire necessary information from the sample.

The size of an objective lens structure in accordance with the present invention can be reduced to such an extent that the diameter thereof ranges from 2 cm to 5 cm. An optical sample height measurement apparatus 91 may be disposed in the vicinity of the objective lens 74 in order to measure a distance to a sample on the basis of reflection of light 92 from the sample. Thus, the position of the sample can be controlled or an electron beam can be quickly focused on the sample.

Fourth Embodiment

Figure 10A:
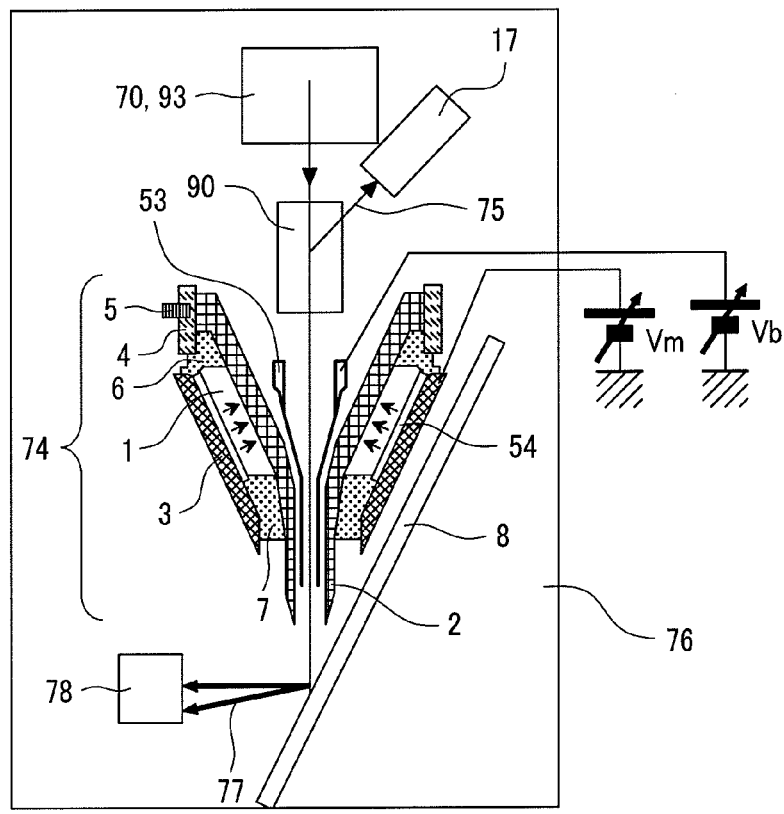
FIG. 10A and FIG. 10B are explanatory diagrams showing the fourth embodiment of the present invention.

FIG. 10A shows the configuration of the fourth embodiment of the present invention.

The present embodiment is a scanning electron microscope (SEM) that includes as an objective lens 74 a structure having an upper magnetic pole 2 thrust out toward a sample and that irradiates an electron beam 10 obliquely to the sample 8. The electron beam 10 can be tilted to fall on the surface of the sample 8 at an angle of approximately 30°. Part of secondary electrons 75 passes through the objective lens in the same manner as that shown in FIG. 9 due to the magnetic field realizing the objective lens, is then accelerated by an upper electrostatic electrode 53, enters an ExB filter 90 at a low velocity, and is then discriminated by a secondary electron detector 17. Electrons 77 backscattered from the surface of the sample are mainly reflected in a direction opposite to the incident direction of electrons. A backscattered electron detector 78 is therefore disposed outside the SEM column so that it will mainly detect the backscattered electrons. A boosting voltage Vb is applied to the electrostatic electrode 53, whereby the electron beam 10 is accelerated and returned secondary electrons 75 are effectively utilized. Moreover, an electrostatic lens effect exerted near the bottom of the objective lens is used to finely adjust a focus or perform automatic focusing.

Figure 6B:
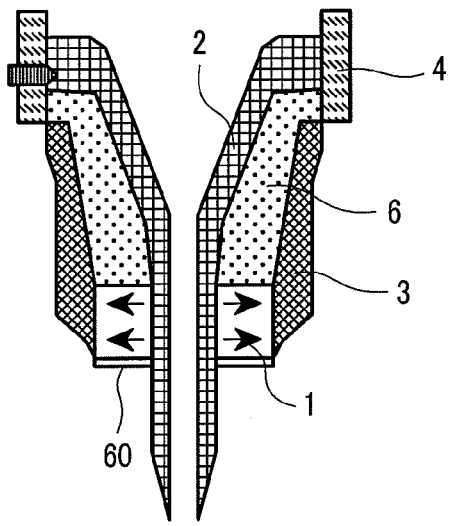
Figure 6C:
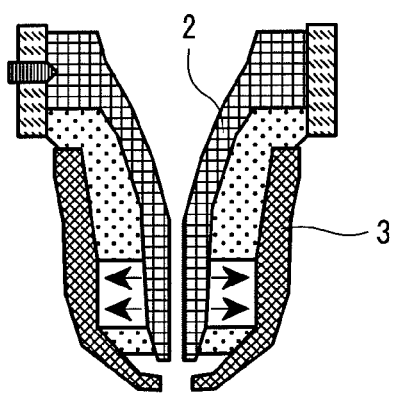

Moreover, unlike the structure shown in FIG. 6B, a sample-side magnetic pole 3 is coupled to a permanent magnet 1 via an insulating substance 54. Moreover, a filling 6 and a cover 7 may be realized with insulating substances and thus isolated from the ground potential so that independent voltages Vm can be applied to the filling 6 and cover 7 respectively. In this case, the voltages Vm may be varied in order to vary a focus. This may be used as an automatic focusing mechanism. Since the trajectory of secondary electrons to be detected is little affected, focusing can be achieved highly precisely. If an electrode realized with a non-magnetic substance is extended from the bottom of the sample-side magnetic pole 3 and approached to the tip of the upper magnetic pole 2, the voltages Vm can be stepped down and focusing conditions can be varied.

Figure 10B:
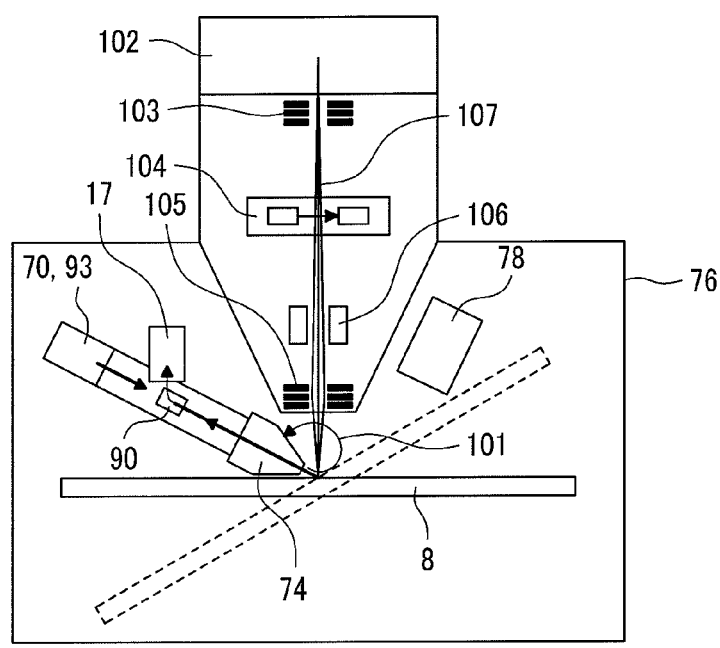

FIG. 10B shows an example in which the SEM column shown in FIG. 10A and a focused ion beam column are combined.

An ion beam 107 that is emitted from an ion beam source 102 using a liquid metal of gallium (Ga) and that gains an ionization potential of about 30 kV is irradiated to a sample via an electrostatic condenser lens 103 and an electrostatic objective lens 105 and used as a microscopic probe. The position of the ion spot is controlled using an electrostatic deflector 106 in order to process a sample. A left-hand SEM column is used to observe the sample with a high resolution during the processing and before and after the processing. The SEM column itself is movable. During the processing, the SEM column is separated far away from the sample and the sample is observed with a low resolution. Thus, drifts dispersed from the sample can be prevented from adhering to the SEM column. When observation should be achieved with a high resolution, the SEM column is approached to the sample 8 so that the sample can be observed at a short working distance. Since an objective lens 74 in accordance with the present invention can be designed more compactly than a conventional one realized with coils, it can be disposed below the electrostatic objective lens 105 for the ion beam. This would prove useful.

Moreover, a magnetic field is induced in an isotopic compensator 104 incorporated in an ion beam column for fear a gallium (Ga) spot may part from the sample due to magnetic flux that is represented by magnetic field lines 101 and that leaks out of the objective lens 74. Since gallium contains isotopes of atomic weights 69 and 71 respectively at a ratio of 6:4, an incident point on the sample varies depending on the magnetic field. When the magnetic field is induced in order to realize a high-resolution electron lens, the precision of an ion beam is degraded. In efforts to prevent the degradation, the trajectories of the isotopes are differentiated from each other in advance using the magnetic field induced by the isotopic compensator 104 above the objective lens 105, so that the trajectories will coincide with each other at one point on the sample.

When the objective lens shown in FIG. 6C and designed not to leak a magnetic field is adopted, although a resolution is degraded a bit, the isotopic compensator 104 need not be included. The objective lens shown in FIG. 6C is thus suitable for an inexpensive apparatus.

As described so far by presenting the embodiments, according to the present invention, there is provided a compact magnetic objective lens structure causing little aberration. Consequently, a super compact high-resolution SEM can be realized. Furthermore, a super compact column movable SEM or an ion beam apparatus may be used in combination in order to realize a highly functional electron beam application system.

What is claimed is:

1. An electron lens that focuses an electron beam on a sample, comprising:
   a permanent magnet being axially symmetrical and having a hole in the center thereof; and
   an upper magnetic pole and a sample-side magnetic pole which axially induces a magnetic field,
   wherein the upper magnetic pole and sample-side magnetic pole are made of a soft magnetic material and magnetically coupled to the permanent magnet, and the upper magnetic pole and sample-side magnetic pole axially forms one magnetic lens using a gap created between the upper magnetic pole and sample-side magnetic pole and located near the center of the electron lens;
   a magnetic path that is made of a soft magnetic material and movable in axial directions or rotatable with the axis as a center of rotation is disposed outside the permanent magnet; and
   the magnetic reluctance of the magnetic path outside the permanent magnet can be regulated.

2. The electron lens according to claim 1, wherein a coated layer or a cover is formed on the axial side of the permanent magnet between the upper magnetic pole and the sample-side magnetic pole.

3. The electron lens according to claim 2, wherein an electrostatic electrode exerting an electrostatic lens effect is disposed in or near a place where the electrostatic electrode will be affected by an axial magnetic filed induced as the magnetic lens.

4. The electron lens according to claim 3, wherein the upper magnetic pole or the sample-side magnetic pole is electrically segmented with an insulating substance between the upper magnetic pole and the sample-side magnetic pole, and part of the upper magnetic pole or the sample-side magnetic pole is used as the electrostatic electrode.

5. The electron lens according to claim 1, wherein an electrostatic electrode exerting an electrostatic lens effect is disposed in or near a place where the electrostatic electrode will be affected by an axial magnetic field induced as the magnetic lens.

6. The electron lens according to claim 5, wherein the upper magnetic pole or the sample-side magnetic pole is electrically segmented with an insulating substance between the upper magnetic pole and the sample-side magnetic pole, and part of the upper magnetic pole or the sample-side magnetic pole is used as the electrostatic electrode.

7. A charged particle beam apparatus comprising:
   an electron beam source;
   an electron optical system including an electron lens that focuses an electron beam emitted from the electron beam source on a sample; and
   a means that detects secondary electrons emitted from the sample, produces an image, and displays the image,
   wherein the electron lens includes a permanent magnet being axially symmetric and having a hole in the center thereof, and an upper magnetic pole and a sample-side magnetic pole which axially induce a magnetic field;
   the upper magnetic pole and sample-side magnetic pole are made of a soft magnetic material and magnetically coupled to the permanent magnet, and the upper magnetic pole and sample-side magnetic pole axially forms a magnetic lens using a gap created between the upper magnetic pole and sample-side magnetic pole and located near the center of the electron lens;
   a magnetic path made of a soft magnetic material and movable in axial directions or rotatable with an axis as a center of rotation is disposed outside the permanent magnet; and
   the magnetic reluctance of the magnetic path outside the permanent magnet can be regulated.

8. A manufacturing method for the electron lens according to claim 1, comprising the step of: performing magnetization, after the permanent magnet made of a material that does not exhibit magnetism or stays in about 10% or less saturation magnetization, the upper magnetic pole, and the sample side magnetic pole are assembled.

9. The manufacturing method for the electron lens according to claim 8, wherein after the completion of the magnetization, the permanent magnet is annealed or aged in order to suppress a temperature-dependent change in the magnetism of the permanent magnet; and thereafter, while the axial magnetic field is measured, the magnetic path is adjusted and secured.

10. The electron lens that focuses an electron beam on a sample, comprising:
    a permanent magnet having a hole in a center thereof, being axially symmetrical, and exhibiting axially symmetrical magnetism; and
    an upper magnetic pole and a sample-side magnetic pole which axially induce a magnetic field,
    wherein the upper magnetic pole and sample-side magnetic pole are made of a soft magnetic material and magnetically coupled to the permanent magnet, and the upper magnetic pole and the sample-side magnetic pole axially forms a magnetic lens using an inner gap created between the upper magnetic pole and the sample-side magnetic pole;
    wherein an outer gap between the upper magnetic pole and the sample-side magnetic pole is located outside the inner gap relative to an axis on the side of the sample, and the outer gap borders the portion of an outside magnetic path, which routes an outside portion of flux generated from the permanent magnet, offering the highest magnetic reluctance;
    wherein a space defined by the permanent magnet, the upper magnetic pole, and the sample-side magnetic pole is filled with a filing made of a non-magnetic material;
    wherein a magnetic path to be used to regulate the magnetic reluctance of the outside magnetic path is disposed outside the permanent magnet as a means for regulating the axial magnetic field;
    wherein the magnetic path is shaped substantially like a cylinder, made of a soft magnetic material, and movable in axial directions; and
    wherein a locking means is included for locking the magnetic path relative to the electron lens.

11. The electron lens according to claim 10, wherein an electrostatic electrode exerting an electrostatic lens effect is disposed in or near a place where the electrostatic electrode will be affected by an axial magnetic field induced as the magnetic lens.

12. The electron lens according to claim 11, wherein the upper magnetic pole or the sample-side magnetic pole is electrically segmented with an insulating substance between the upper magnetic pole and the sample-side magnetic pole, and part of the upper magnetic pole or the sample-side magnetic pole is used as the electrostatic electrode.

13. The electron lens according to any of claim 3, 4, 11, 12, wherein a samarium-cobalt system or a neodymium-iron-boron system is adopted as a material to be made into the permanent magnet.

14. The electron lens according to any of the claims 1, 2, 5, 6, 10, wherein a samarium-cobalt system or a neodymium-iron-born system is adopted as a material to be made into the permanent magnet.

15. The charged particle beam apparatus according to claim 7, wherein:
  the electron lens includes a permanent magnet that has a hole in the center thereof, that is axially symmetrical, and that exhibits axially symmetrical magnetism;
  the upper magnetic pole and the sample-side magnetic pole form a magnetic lens on a center axis using an inner gap created between the upper magnetic pole and the sample-side magnetic pole;
  an outer gap between the upper magnetic pole and the sample-side magnetic pole is located outside the inner gap relative to the center axis on the side of the sample, and the outer gap borders the portion of the outside magnetic path, which routes an outside portion of flux generated from the permanent magnet, offering the highest magnetic reluctance; and
  a space defined by the permanent magnet, the upper magnetic pole, and the sample-side magnetic pole is filled with a filling made of a non-magnetic material.

16. The charged particle beam apparatus according to claim 15, wherein:
  an ion beam optical system is included for focusing an ion beam emitted from an ion beam source on the sample, via an electrostatic objective lens and deflecting the ion beam; and
  the electron optical system and the ion beam optical system are incorporated in the same vacuum chamber.

17. The charged particle beam apparatus according to claim 16, wherein:
  the electron lens included in the electron optical system is a structure in which the inner gap created between the upper magnetic pole and the sample-side magnetic pole is oriented outside the axis;
  the ion beam optical system includes a magnetic field generating means located on the side of the ion beam source beyond the electrostatic objective lens;
  different trajectories are formed in association with different masses of ions; and
  the trajectories of ions having different masses coincide with each other at one point on the sample or a focus owing to a magnetic field included in the electron optical system.

18. The charged particle beam apparatus according to claim 7, wherein:
  the electron optical system includes at least one electrode forming an electrostatic lens;
  the electron beam source is realized with a zirconium-oxygen or zirconium-tungsten Shottky electron beam source or a tungsten field emission electron beam source; and
  a non-evaporable getter is used as a major evacuation means.

19. The charged particle beam apparatus according to claim 7, wherein a moving mechanism is included for moving the electron beam source and the electron optical system so that the position of the sample or an angle with respect to the sample can be varied.

* * * * *